United States Patent [19]

Aichert et al.

[11] 4,192,253
[45] Mar. 11, 1980

[54] VACUUM COATING APPARATUS

[75] Inventors: Hans Aichert, Hanau am Main; Friedrich Stark, Langenselbold; Herbert Stephan, Bruchköbel; Otto-Horst Hoffmann, Rodenbach, all of Fed. Rep. of Germany

[73] Assignee: Leybold-Hereaus GmbH, Cologne, Fed. Rep. of Germany

[21] Appl. No.: 962,835

[22] Filed: Nov. 21, 1978

[30] Foreign Application Priority Data

Mar. 25, 1978 [DE] Fed. Rep. of Germany ....... 2813180

[51] Int. Cl.$^2$ .......................................... C23C 13/08
[52] U.S. Cl. .................... 118/712; 118/730; 204/192 R; 427/35; 427/38; 427/42; 427/252; 427/295; 414/217
[58] Field of Search ................ 118/49, 49.1; 204/192 R; 427/34, 35, 38, 42, 252, 295; 414/217

[56] References Cited

U.S. PATENT DOCUMENTS

| | | | |
|---|---|---|---|
| 3,272,175 | 9/1966 | Lorenz et al. | 118/49 |
| 3,336,898 | 8/1967 | Simmons et al. | 118/49 |
| 3,714,925 | 2/1973 | Helm | 118/49 |
| 3,858,547 | 1/1975 | Bergfelt | 118/49 |
| 4,010,710 | 3/1977 | Williams | 118/49 |
| 4,034,704 | 7/1977 | Wössner et al. | 118/49 |
| 4,062,318 | 12/1927 | Ban et al. | 118/49 |

*Primary Examiner*—Edward C. Kimlin
*Attorney, Agent, or Firm*—Sprung, Felfe, Horn, Lynch & Kramer

[57] ABSTRACT

Vacuum apparatus for coating substrates by rotation including a vacuum chamber with an elongated material source having a longitudinal axis and a transverse axis, a substrate rack with a plurality of fastening points for the planar arrangement of a plurality of substrates above the material source in a substantially uniform distribution over its surface and a drive associated with the substrate rack for rotating substrates. The substrate rack has to parallel substrate bearers disposed fork-wise with couplings for the substrates positioned on the confronting inner sides of the substrate bearers. The substrate bearers are connected by angle drives to the substrate couplings and a motor via a drive shaft.

15 Claims, 4 Drawing Figures

VACUUM COATING APPARATUS

BACKGROUND

This invention relates to vacuum coating apparatus for coating substrates on all sides by rotation of the substrates in a material stream including a vacuum chamber having an elongated material source with a longitudinal axis and a transverse axis, a substrate rack provided with a plurality of fastening points for the planar disposition of a plurality of substrates above the material source in a substantially uniform distribution over the surface thereof, and a drive associated with the substrate rack for the production of a rotatory movement of the substrates.

The coating methods involved are the vacuum depositing method, the cathode spray method, the ion plating method, the chemical vapor deposition (CVD) method, and related methods.

It is known to provide substrates with a thin surface coating on all sides by subjecting them to a rotatory movement within a directed vapor stream and/or by passing them through the vapor stream while subjecting them to a rotatory movement. For this purpose the substrates can be mounted individually on shafts and brought into the vapor stream while rotating about the shaft axis. For the purpose of driving the shafts, gears or rollers are provided on the shaft ends and roll upon a stationary rack or rail. In the manner thus described, resistance coatings have been applied to tubular insulators; the known apparatus and methods of this kind, however, are limited to small substrates or to a small number of substrates.

It is also known to fasten geometrically simple substrates, such as optical lenses and filters, for example, on substrate racks or holders and to pass them periodically through the vapor stream while performing complex, composite movements. Such apparatus or methods are again suitable only for relatively small substrates whose shape presents no problems as far as a uniform distribution of the coating thickness is concerned.

The purpose of vapor depositing on large numbers of relatively complex parts, such as reflectors for motor vehicle headlights, for example, it is known to dispose the substrates on substrate holders or racks which are disposed for rotation within a substantially cylindrical cage. The vapor source is inside of the cage, so that, when the cage is rotated, the substrates are moved through the upwardly directed vapor stream. In this case, the substrate holders perform an additional rotatory movement within the cage based on a superimposed drive; this additional movement can be described as an involute movement. In the manner thus described, a very good distribution of the coating thickness is achieved on the basis of the law of probability. Such an apparatus, however, is not suitable for extremely irregularly shaped substrates of large dimensions, which are to be vapor coated in batches with high-melting metals or metal alloys, when the substrate temperatures are to be above, for example, 500° C.

Examples of substrates of especially complex geometrical shape, in which great value is placed on a uniform coating thickness distribution, on the distribution of the alloy elements through the coating, and great strength of adhesion by intermetallic diffusion, are turbine blades for gas turbine engines, such as those used in aviation. The problems involved in the surface coating of such turbine blades are described in a publication entitled, "High Temperature Resistant Coatings for Super-Alloy" by Seelig et al of Chromalloy American Corporation, New York. It has hitherto been extremely difficult to produce such coatings with the required properties on a large industrial scale at economically acceptable prices. One special problem is the transmission of a defined rotatory movement from a drive motor to a plurality of substrates, and the relatively high losses of expensive vapor material which condenses on the internal surfaces of the vapor depositing apparatus rather than on the substrates, producing undesirable incrustation. This problem can be counteracted to a certain extent by a compact arrangement of the substrates in the vapor stream or above the evaporating crucible, as the case may be; the individual substrates, however, must not interfere with one another in performing their rotary movement.

SUMMARY

The invention provides a vacuum coating apparatus of the kind described above which makes it possible to provide substrates of complex shape with metallic surface coatings of very specific properties on a large industrial scale, without unreasonable waste of the coating material.

This is achieved in accordance with the invention by the fact that the substrate rack has two parallel substrate bearers in a fork-like arrangement, whose longitudinal axes B-B and C-C are in a mirror-image symmetrical relationship to a vertical plane of symmetry passing through the longitudinal axis A-A of the material source, that couplings for the substrates are disposed on the confronting inner sides of the substrate bearers, the axes of rotation of the couplings being perpendicular to the plane of symmetry, and that one drive shaft is associated with each of the substrate bearers and is disposed longitudinally thereof, and is connected by an angle drive on the one hand to the couplings and on the other hand to a motor.

DESCRIPTION

Such a method of construction makes possible a relatively compact disposition of the substrates between the two bearers, the arrangement of substrate bearers and substrates being in the form of a pair of racks with confronting rows of teeth. The substrates themselves can be disposed above the material source in an optimum position in the material stream, while the two substrate bearers along with the drive shafts and angle drives contained within them are situated outside of the material stream. This is advantageous when an evaporating crucible is used as the material source, especially because a considerable amount of heat is radiated from the evaporating crucible, whose content has to be heated to a temperature of around 1500° C. for the evaporation of oxidation-resistant and corrosion-resistant alloys. In addition, it is often necessary for the substrates to be heated. In the case of gas turbine blades, for example, these have to be kept at a temperature of approximately 1000° C. in order to bring about sufficient intermetallic diffusion. By applying the teaching of the invention it becomes possible by inserting spacers between the couplings and the substrates to provide for a spacing that will protect the substrate bearers against excessive heating. And yet it is possible to provide in a simple manner for a uniform rotatory movement of all substrates by means of a drive situated outside of the vapor depositing zone, and even outside of the vacuum chamber.

The "packing density," as it is called, of the substrates in the material stream can be further increased by offsetting the couplings of the one substrate bearer from the couplings of the other substrate bearer lengthwise by half of the spacing between each two adjacent couplings. If this is done, the substrates held by the one substrate bearer can be alternated with those held by the other. Thus the individual substrates can be brought so close to one another that they just escape interfering with one another in their movement. Alternating the substrates of the one bearer with those of the other enables the drive shafts and angle drives to be housed within the bearers if the latter are in the form of hollow bodies.

The simultaneous driving of all of the substrates of each substrate bearer can be made especially simple by making the drive shaft continuous through all the couplings, and by making the angle drives to consist each of a pinion on the drive shaft and a crown gear on the coupling shaft. Such a construction has the advantage that any changes in the length of the drive shaft due to thermal expansion will not result in any binding of or damage to the angle drives. The pinions can shift radially of the crown gear without causing any change in the clearance between the teeth. If bevel gears were used instead of crown gears, compensators would have to be provided, for example, for the equalization of the thermal expansion. The coupling shafts are made relatively short, so that any shifting of the position of the crown gears will remain within the tolerances for the meshing of the teeth.

The thickness of the coating deposited per unit of time and per unit of area depends essentially on the attitude angle between the condensation surface and the axis of the material stream. The amount of material that will be deposited per unit of time on a surface that ia aligned perpendicular to the material stream, for example, will be several times the amount condensed per unit of time on a surface aligned parallel with the material stream. In the case of substrates in which surface elements are at an angle to one another, especially a right angle, special difficulties must be anticipated for the above-stated reasons. These difficulties occur especially in the case of gas turbine blades which have a blade and a base. The surface of the base facing the blade is at a more or less right angle to the generatrix of the blade. It is necessary, therefore, to cause a gas turbine blade to rotate not only about is longitudinal axis but also to vary its position about an axis that is perpendicular to the longitudinal axis. The longitudinal axis of a turbine blade is to be understood to be the axis that is parallel or substantially parallel to the generatrix of the blade, or which after the blade is installed in the turbine, will be perpendicular to the turbine axis.

The superimposed movement that is required can be brought about in accordance with the invention in an especially simple manner by disposing the substrate bearers on two radial arms which can be rocked about a common axis D—D situated in the plane of symmetry of the material source, the axis D—D being located also on the plane of symmetry of the two rocking movements. Simply stated, this means that the longitudinal axes B—B and C—C of the parallelly disposed substrate bearers can perform rocking movements describing a portion of a cylinder surface, the included angle of each cylinder surface amounting preferably to 90 degrees. The plane of symmetry of the two rocking movments, which is a horizontal, diametrical plane of the cylinder, also contains the pivot axis, i.e., the pivoting angle of the two substrate bearers, downward and upward from the plane of symmetry, amounts, under the above assumptions, preferably to 45 degrees each. The substrates which are situated above the material source and whose centers are located in the vertical plane of symmetry passing through the material source thus perform rocking movements about the axis D—D running through the centers of the substrates. As a result, the outer boundary surface of the blade base is exposed to the material stream at a more favorable angle, so that a more effective condensation takes place at this point, and hence a more effective build-up of the coating.

The guidance of the substrate bearers and the mounting of the radial arms is achieved in an especially simple manner by the fact that the arms are disposed each on one of two coaxial hollow shafts which are connected to one another by a reverse gearing whose idler gear is stationary. The two hollow shafts provide a mounting that is resistant to bending and twisting, while the stationary idler gear brings about a contrary movement of the two substrate bearers. This contrary movement makes it possible to perform the rocking movements of the bearer arms irregularly, i.e., the bearer arms can be stopped or retarded when the substrates are in a coating position which has been found advantageous, the substrates, which are disposed in a basically mirror-image relationship, being all exposed to the material stream in the same attitude.

The transmission of the rotary movement from a motor to the substrates, which is necessary for the substrate rotation, is accomplished within the hollow shafts of the arms in an especially simple and effective manner in that, within the hollow shafts serving for the movement of the arms, an additional coaxial shaft system is disposed for the transmission of a rotatory movement to the substrates, a reverse gearing being disposed between the shafts and having a stationary idler gear. This reverse gearing brings it about that not only do all substrates turn in the same direction, but also any superimposed rotatory movements act in the same sense on the rotation of the substrates. As it will be further explained below, this measure is important especially because a rocking movement of the substrate bearers produces a rotatory movement or change in the position of the substrates even when the drive motor for the substrate rotation is stopped, due to the fact that the gears of the angle drives roll on one another during the rocking movement of the substrate bearers.

It is desirable for a rocking drive to be associated with the hollow shafts for the movement of the arms, and to be composed of a motor and a crank driving a rocking driven wheel connected to one of the hollow shafts. This connection does not have to be a direct one, and additional transmission members can be interposed, as will be further explained in the detailed description. In a crank drive of this kind, it is possible by varying the cranking radius on the shaft of the driving motor to vary the rocking angle of the driven rocking wheel and thus the rocking angle of the substrate bearers.

It has already been stated above that the rocking movement of the substrate bearers results in a rocking movement of the substrates even when the drive motor for the rotational movement of the substrates is stopped. If the motor for the rotation of the substrates is running, this would result in a rocking movement being superimposed on the uniform (for example) rotatory movement of the substrates, so that the circumferential velocity of the substrates continually changes. To prevent this, it is proposed according to the invention that the coaxial shaft system for the transfer of the rotatory movement to the substrates be associated with a motor which is mounted in a pivot bearing for rotation about the motor axis, and that the motor be connected to the driving crank wheel for the rocking movement of the radial arms in a 1:1 ratio. If this is done, the motor, or motor casing, will perform a periodical rocking movement which, of course, is superimposed upon the rotatory movement of the motor shaft. Due to the coupling of the driven rocking wheel to the motor in a 1:1 ratio, the effect of the rocking movement of the substrate bearers is precisely compensated, so that the substrates perform precisely a rotatory movement which corresponds to the rotatory movement of the substrate rotation drive motor.

The means for the driving of the driven wheel which produces the rocking movement of the hollow shafts and of the drive motor for the substrate rotation can be simiplified especially by the fact that the driven wheel of the crank drive is connected to the hollow shafts of the radial arms and to the substrate rotation motor by means of a common, slip-free driving means. Gears and chain drives can serve, for example, as slip-free driving means. However, gear belts are used with special advantage.

In order to bring only the substrates into the material stream, while the substrate bearers are situated outside of the material stream, it is furthermore proposed that the substrate bearers be cantilevered on a carriage and be introduced into the vacuum chamber by means of the carriage. The carriage can remain outside of the vacuum chamber during the coating process, in the loading chamber, for example.

It is especially desirable for the carriage to have a housing in which the reverse gearing of the hollow shafts and the hollow shaft system will be contained, and in which the hollow shafts are journaled, and to provide ball bearing spline shafts and ball boxes for the transfer of the torque from the stationary motors to the reverse gearing. This measure assures the low-loss transfer of the torque from the drive motors to the corresonding parts within the housing and on the carriage.

For the supervision of the coating process it is especially important to be able at all times to know the attitude of the substrates in relation to the material source. For this purpose it is proposed that the shaft of the motor producing the rotatory movement of the substrates be connected to a position indicator to show the attitude of the substrates on their axis of rotation with respect to the coating source. Since a compensatory rocking movement is already superimposed on the shaft of this motor, the effect of the rocking movement of the substrate bearers is completely compensated with respect to the position indicators, so that the indication will be free of error.

It is very particularly advantageous that the driven wheel of the crank drive for the rocking of the arms be likewise associated with a position indicator to indicate the attitude angle of the radial arms, it being desirable for both of the position indicators to be disposed concentrically with one another. It will thus be possible to see at a glance what position the bucket profiles and the long axes of the buckets have assumed with respect to the material source.

An especially compact embodiment of the substrate rack which is little affected by the condensation of material is lastly characterized by the fact that the ends of the coaxial hollow shafts adjacent the substrate bearers are in the form of nested casings from which the arms extend radially outward to the substrate bearers, that angle drives are disposed in the casings and shafts are disposed in the arms for the transmission of the rotatory movement to the drive shafts in the substrate bearers, and that casings are likewise located at the junctions between the arms and the substrate bearers in which additional angle drives are disposed.

An embodiment of the invention along with details pertaining thereto will be further explained below with reference to FIGS. 1 to 4, which show a vacuum depositing apparatus as the coating apparatus. The material source in this case is a rectangular evaporating crucible. In a cathode spraying apparatus, a rectangular cathode wwould replace the evaporating crucible. The elongated material source can also be replaced by a tandem arrangement of a plurality of individual round or square material sources, for example, which together form what is referred to as a "source field."

Figure 1:
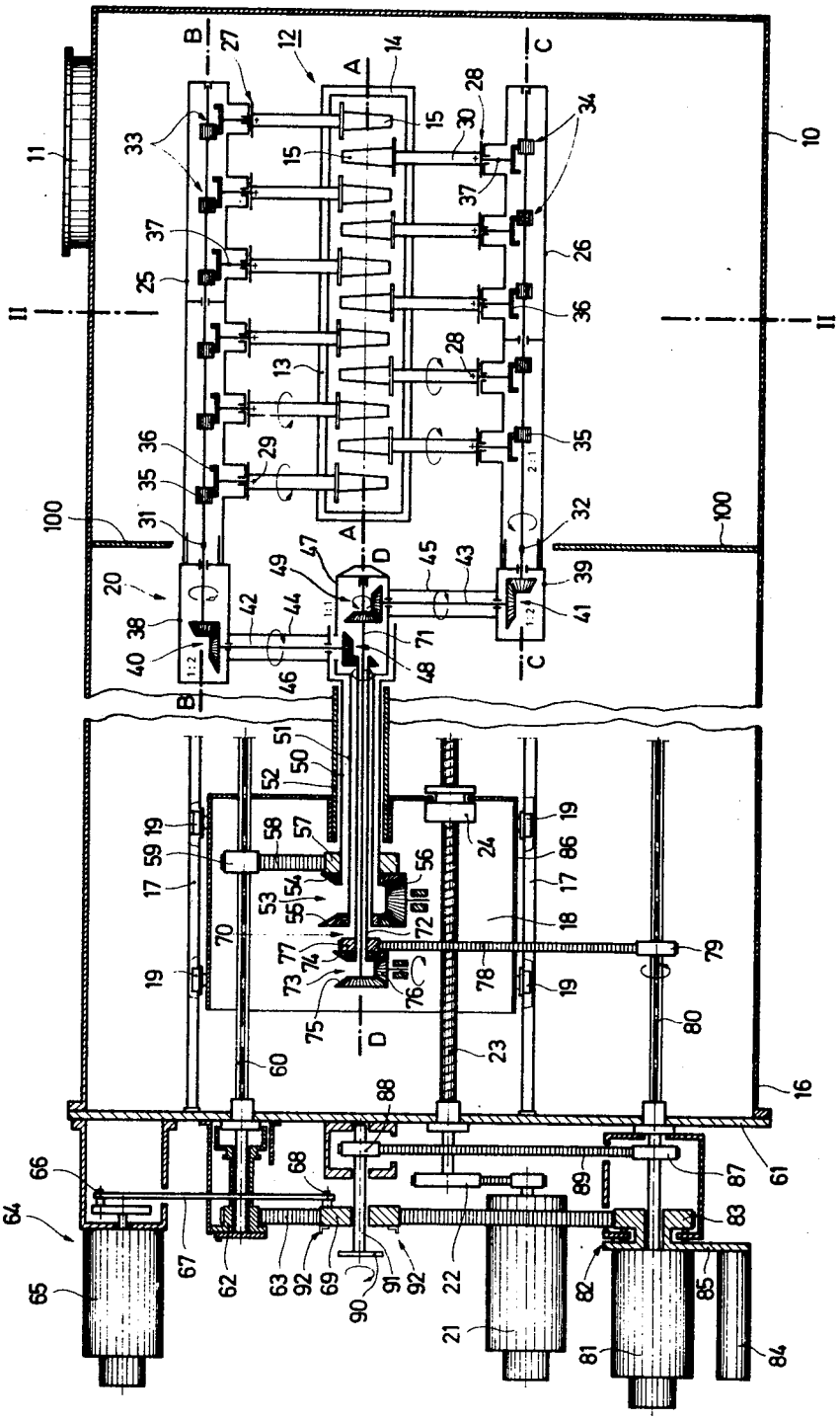
FIG. 1 is a diagrammatic representation of a horizontal cross section taken through a complete vacuum depositing apparatus.

In vacuum chamber 10, which can be evacuated through a vacuum connection 11, an elongated material source 12 is disposed in the form of an evaporating crucible having long sides 13 and short sides 14. Eleven substrates 15 are arrayed in tandem parallel with the longitudinal axis A—A of the evaporating crucible in an even distribution over the area thereof, the substrates in the present case being gas turbine blades. In the position illustrated, the center points of the substrates 15 are within a vertical plane of symmetry passing through the longitudinal axis A—A, and the long axes of the substrates are perpendicular to this plane of symmetry.

The vacuum chamber 10 is connected by means of a lock system (not shown) to loading chamber 16 in which there is disposed a carriage 18 which can travel horizontally along rails 17. This carriage is provided with wheels 19 which are engaged in the channel-shaped rails 17. This is necessary because a substrate rack 20 is cantilevered on the carriage 18 such that a tilting moment is exercised on the carriage. By means of a motor 21, a belt drive 22, a threaded spindle 23 and a spindle nut 24 fastened to the carriage, the carriage 18 can be driven far enough to move the substrate rack 20 from the loading chamber 16 to the illustrated position within the vacuum chamber 10. The substrate rack consists of two parallel substrate bearers 25 and 26 disposed in a fork-like manner, whose longitudinal axes B—B and C—C are in a mirror-image symmetrical relationship with the plane of symmetry passing through the longitudinal axis A—A. Couplings 27 and 28 for the substrates 15 are disposing on the confronting inner sides of the bearer arms, the rotational axes of the couplings being aligned perpendicular to the above-named plane of symmetry. Between the couplings 27 and 28 and the substrates 15 are spacers 29 and 30, respectively.

The substrate bearers 25 and 26 are hollow and each contains a drive shaft 31 and 32 these shafts being connected by angle drives 33 and 34 to the couplings 27 and 28. The couplings 27 of the one substrate bearer 25 are offset longitudinally of the substrate bearers from the couplings 28 of the other bearer by half of the spacing between adjacent couplings. This makes it possible to arrange the substrates fastened to the one bearer 25 alternately with the substrates 15 disposed on the other bearer 26, so that a greater axial distance will exist between the individual right-angle drives 33 and 34. These angle drives consist each of a pinion 35 and a crown gear 36. It can be seen in FIG. 1 that, if a stationary bearing is disposed at the left end, and a thermally caused increase in the length of the drive shafts 31 and 32 occurs, the pinions 35 will be subjected to an increasing longitudinal displacement from left to right, but, due to the use of crown gears 36, this will have no undesirable effect on the meshing of the teeth. Between the couplings 27 and 28 and the crown gears 36 are coupling shafts 37, which can nevertheless be very short. By the appropriate selection of a free play between pinion 35 and crown gear 36, provision can be made so that a change in the length of the coupling shafts 37 will have no undesirable influence on the meshing of the teeth.

The substrate bearers 25 and 26 are each fastened to a casing 38 and 39, respectively, into which the drive shafts 31 and 32 are also prolonged. Within the casings are angle drives 40 and 41, respectively, which are connected to radial shafts 42 and 43, respectively. The ratios of the angle drives 33-34 and 40-41 are selected such that the coupling shafts 37 will rotate at the same rotatory speed as the shafts 42-43.

The casings 38 and 39 are joined by radial arms 44 and 45, which are hollow and contain the shafts 42 and 43, to casings 46 and 47 which contain angle drives 48 and 49 which are of a ratio of 1:1. The arms 44 and 45 are rotatable about a common axis D—D which lies in the same plane of symmetry as the longitudinal axis A—A of the evaporating crucible 12.

The rocking of the arms 44 and 45 is brought about by the fact that they are fastened to a pair of coaxial hollow shafts 50 and 51 which are borne within a tube 52 which is fastened to the carriage 18. The casings 46 and 47 thus constitute prolongations of the hollow shafts 50 and 51. At their opposite ends, the two hollow shafts 50 and 51 are connected together by a reverse gearing 53 consisting of the bevel gears 54 and 55 and the stationary idler gear 56. The reverse gearing 53 has the effect that a rotatory movement of the hollow shaft 50 is accompanied by a rotatory movement of hollow shaft 51 that is equal but of opposite sense. Consequently, if one of the two hollow shafts 50 or 51 is driven with a rocking movement, rocking movements of the two radial arms 44 and 45 will take place which will be similar to the movements of the wings of a butterfly. Starting out from a horizontal plane of symmetry passing through the axis D—D, the rocking angles of the arms 44 and 45 are of equal magnitude both upwardly and downwardly and amount to approximately 45 degrees each. This rocking movement is followed, of course, by the substrate bearers 25 and 26 and by the substrates 15 which thus perform rocking movements about an axis which is situated above the material source 12 and in its plane of symmetry. This axis passes approximately through a point which is situated at half the length of each substrate.

For the production of the rocking movement, there is disposed on the hollow shaft 50 a gear 57 over which a gear belt 58 is guided. This gear belt passes over another gear 59 which is corotational with but longitudinally movable on a ball-bearing spline shaft 60 which is carried through one end wall 61 of the loading chamber 16. At its outside end, the ball-bearing spline shaft 60 is affixed to a gear 62 which is connected by a gear belt 63 to a rocking drive 64. The rocking drive consists of a motor 65 whose output shaft has a crank pin 66 to which a connecting rod 67 is joined. The other end of the connecting rod is joined by another crank pin 68 to a driven gear 69 which is engaged with the gear belt 63 in a slip-free manner. The cranking radius of the crank pin 66 is smaller than the cranking radius of crank pin 68, so that, upon a rotation of the shaft of the motor 65, the driven gear 69 will perform a rocking movement. The angle of this rocking movement is identical to the rocking angle of the radial arms 44 and 45, and attention must be paid to this in establishing the transmission ratios in the gear belt drives. Preferably, the cranking radius of the crank pin 66 is adjustable, so that the rocking angle of arms 44 and 45 can be variable accordingly. The rocking movement of the driven gear 69 is distributed through the gear belts 63, the gear 62, the ball-bearing spline shaft 60, the gear 59 and the gear belts 58 to gear 57 and thus to the external hollow shaft 50. The rocking movement of the substrate bearers can also be asymmetrical, i.e., moving upwardly from a horizontal plane. This can be accomplished by changing the length of the connecting rod 67.

From the input side of the angle drives 48 and 49, a coaxial shaft system 70, which consists of a central shaft 71 and a hollow shaft 72 and is likewise coaxial with the hollow shafts 50 and 51, extends to a reverse gearing 73 consisting of the bevel gears 74 and 75 and a stationary idler gear 76. The reverse gearing has the effect that the central shaft 71 and the hollow shaft 72 are driven at the same rotatory speed but in opposite senses when, for example, the hollow shaft 72 is made to rotate. This is accomplished by means of a gear 77 disposed on the hollow shaft, over which a gear belt 78 passes which also runs over a gear 79 which is corotational with a ball bearing spline shaft 80 but longitudinally displaceable thereon, the ball bearing spline shaft 80 being brought through the end wall 61 of the loading chamber 16 to a motor 81. The rotation of the motor shaft is distributed through the ball bearing sliding shaft 80, the gear 79, the gear belt 78, the gear 77 and the reverse gearing 73 with the coaxial shaft system 70, to the angle drives 48 and 49. From there the rotatory movement is transmitted by the radial shafts 42 and 43 to the angle drives 40 and 41 and to the drive shafts 31 and 32, which in turn set the couplings 27 and 28 along with the substrates 15 in rotation through the angle drives 33 and 34. As long as the rocking drive 64 is in the state of rest, the momentary angular velocity of the substrates 15 would be the same at all times as the momentary angular velocity of the ball bearing spline shaft 80, even without special measures. But as soon as the arms 44 and 45 are set into periodical or aperiodical rocking movements, the bevel gears on the radical shafts 42 and 43 of angle drives 48 and 49 additionally roll on the corresponding bevel gears on the drive side, so that a rocking component of movement is superimposed on the uniform angular velocity of the ball bearing sliding shaft 80, which, of course, would be imparted to the substrates 15. If the ball bearing spline shaft 80 were to be stopped and the arms 44 and 45 were to perform rocking movements, the substrates 15 would perform rocking movements about their longitudinal axis, which is not desirable under all circumstances.

In order to compensate for this, the motor 81 is mounted so as to rotate as a whole about the motor axis in a pivot bearing 82. Through this pivot bearing, a gear 83 is affixed to the motor casing, and over it passes the gear belt 63 which is also in engagement with the drive gear 69. The gear belt 63 is actually in a triangular configuration which will be further discussed in conjunction with FIG. 4.

By means of the gear belt 63, the rocking movement of the drive wheel 69 is imparted in the same magnitude to the motor 81, since the transmission ratio has been made 1:1. Through the rocking movement of motor 81 as a whole, a periodic or aperiodic component is superimposed on the rotatory movement of the ball bearing spline shaft 80, which corresponds precisely to the component produced by the rocking movement of the arms 44 and 45 and consequently compensates it, so that the angular velocity of the substrates is precisely the same as the angular velocity of the ball bearing spline shaft 80 with respect to the casing of motor 81. If this angular velocity is constant, so is the angular velocity of the substrates 15 constant. To compensate for the drive torque of motor 81 and for the weight of the arms 44 and 45, substrate bearers 25 and 26 and the substrate racks 20, a counterweight 84 is fastened to its casing by means of a radial lever 85. Instead of the gear belt 63, which serves as a slip-free driving means, a chain can be provided, for example, with which appropriately shaped sprockets would be associated.

The carriage 18 has a housing 86 in which the reverse gearing 53 and 73 of the hollow shafts 50 and 51 and of the hollow shaft system 70 are disposed. In this housing and in the tube 52 combined with the housing, all of the hollow shafts are mounted for free rotational movement against one another. The entire system can be displaced along the rails 17 by the threaded spindle 23, the gear belts 58 and 78 being able to accompany it since the gears 59 and 79 are longitudinally displaceable on the ball bearing spline shafts 60 and 80.

A position indicator 90 to indicate the attitude of the substrates on their axis of rotation with respect to the evaporating crucible 12 is connected to the ball bearing spline shaft 80 of motor 81 by means of the gears 87 and 88 and the gear belts 89. The position indicator 90 can be represented in its simplest form as a diagram of the substrate cross section (a blade profile) and it can be mounted on a shaft 91 which is connected with the gear 88 and is journaled coaxially in the drive gear 69. By means of the position indicator 90 it can be determined at all times which relative position the substrates 15 have assumed with relation to the surface of the material source 12 or vapor current, as the case may be.

It is desirable also to provide on the crank drive gear 69 which generates the rocking movement of levers 44 and 45 a position indicator 92 to indicate the angular attitude of the arms 44 and 45; in its simplest form this indicator can consist of colored markings. The position indicators 90 and 92 can be provided with signaling contacts permitting remote observation, although this is not indicated in the drawing.

Figure 2:
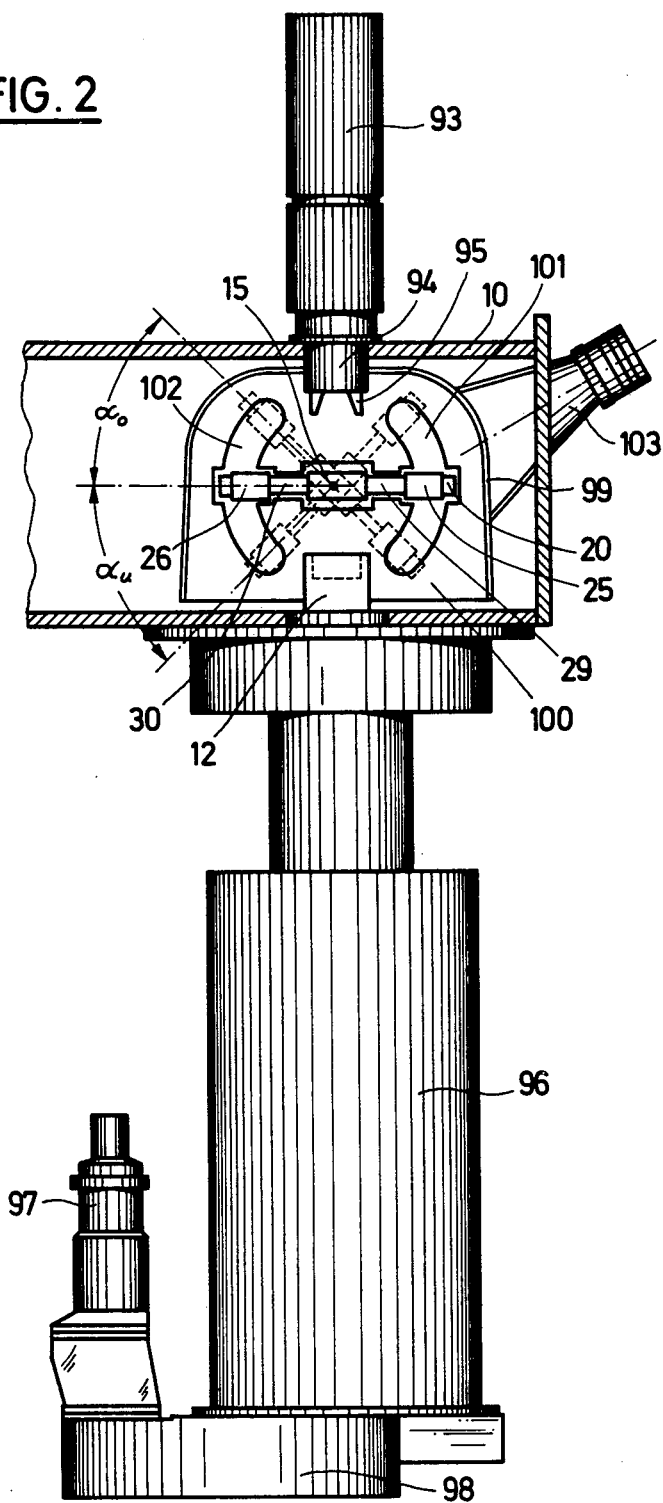
FIG. 2 is a vertical cross section taken along line II—II of FIG. 1, showing additional details.

In FIG. 2, parts identical to those in FIG. 1 are given the same reference numbers. On the vacuum chamber 10 there are disposed two electron guns 93 of which, however, only the front one is visible in the drawing. The latter has at its bottom end an X-Y deflection system 94, of which only the pole shoes 95 of the X-axis deflection system are visible. By means of the X-Y deflection system 94, the electron beam produced by the electron gun 93 can be deflected onto the evaporation material in the evaporating crucible. The evaporating crucible is supplied with material from below by a charging means which is disposed within the supply reservoir 96. A motor 97 with a belt drive 98 is provided for delivering the material from the supply reservoir 96 to the evaporating crucible.

In FIG. 2, the substrate rack 20 is represented by solid lines in a position in which the two substrate bearers 25 and 26 are in a horizontal plane in which the axis D—D is also located, about which the two radial arms 44 and 45 can be rocked (FIG. 1). Starting out from this position, the two substrate bearers 25 and 26 can be shifted, one upward and one downward, to the positions represented in broken lines, at the angles $\alpha_o$ and $\alpha_u$, and vice versa, in which positions the substrates 15 will have their long axes at equal angles of inclination. In the vacuum chamber 10 is a radiation shield 99 with an end wall 100 which is also represented in FIG. 1. In the radiation shield are two arcuate openings 101 and 102, whose center of curvature coincides with the axis D—D. These openings serve for the passage of the substrate bearers 25 and 26 and for the performance of their rocking movements. For the observation of the process, the vacuum chamber 10 is provided with an inspection means 103.

Figure 3:
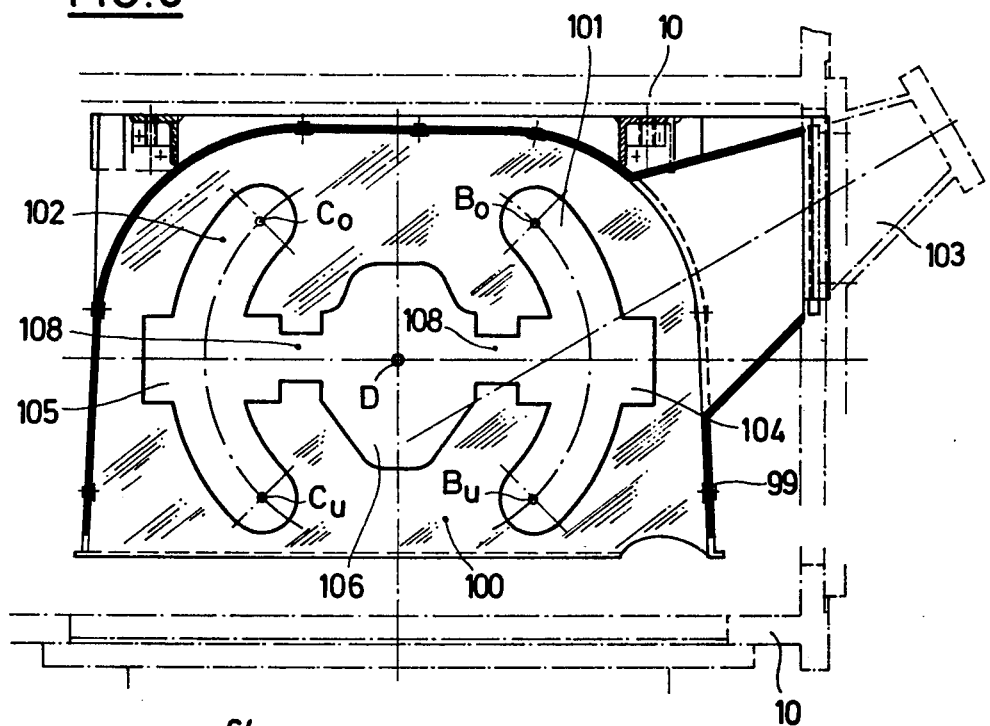
FIG. 3 is an elevational view of a radiation shield within the vacuum chamber, through which the substrate rack can be guided.

In FIG. 3, additional details of the radiation shield 99 and its end wall 100 are to be seen. The axis D, which is also the axis of rotation of the hollow shafts and of the coaxial shaft system 50-51 and 70 (FIG. 1), is also represented in FIG. 3. Also included in this figure are the upper end positions $B_o$ and $C_o$ and the bottom end positions $B_u$ and $C_u$ of the axes B and C of the carrier arms 25 and 26, the position of these axes being given by the tilt angles $\alpha_o$ and $\alpha_u$ (FIG. 2). The shape of the arcuate openings 101 and 102 is given by striking a circle about D through the points $B_o$, $B_u$, $C_o$ and $C_u$, and that semicircles are struck around the above-named points, whose diameter corresponds to the width of the openings. By connecting up the end points of the semicircles in this manner, the boundary lines of the recesses are defined. These openings have, in their center, in which the horizontal plane of symmetry of the substrate rack is also located, enlargements 104 and 105 which provide enough clearance for the passage through them of the carrier arms 25 and 26. The central area about the axis D—D is also provided with a corresponding enlargement 106, the enlargements 104 and 105 being joined together by slots 107 and 108.

Figure 4:
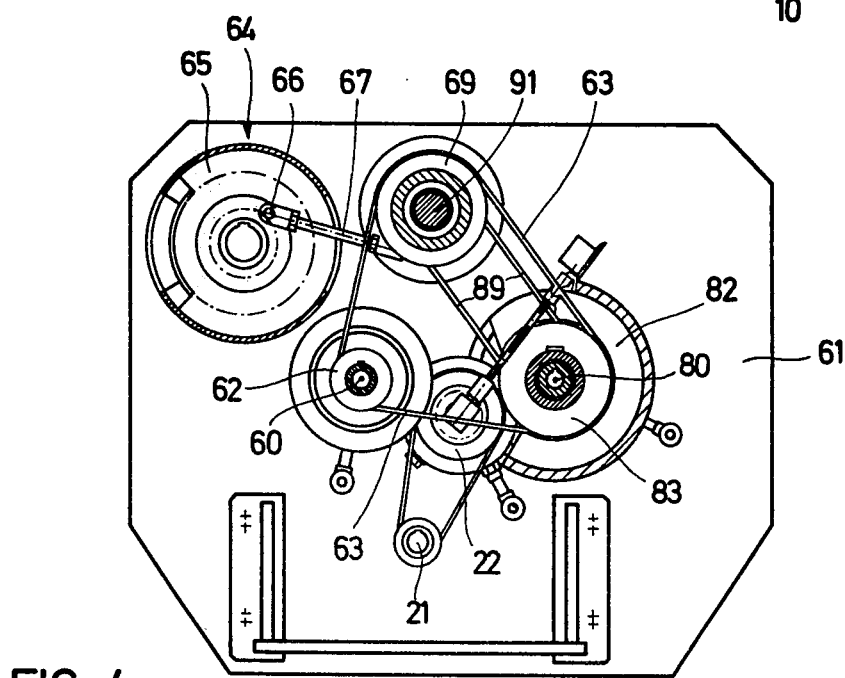
FIG. 4 is an elevational view of the entire drive system for the rotation of the substrates, the rocking movement of the substrate bearers, and the advancement of the chassis.

In FIG. 4, which represents an end view of the end wall 61 of FIG. 1 as seen from the left, showing the individual parts in their actual spatial arrangement, it can be seen how the motor 65 of the rocking drive 64 acts through the connecting rod 67 on the driven wheel 69. When the crank pin 66 revolves, the driven wheel 69 is set into a rocking movement which is also imparted to the gear belts 63 and the gears 62 and 83 meshing with them. The ball bearing spline shaft 60 driven by gear 62 leads, for example, to the reverse gearing 53 for the production of the rocking movement of the substrate bearers 25 and 26, while the gear 83 rocks the motor 81 (FIG. 1) with the ball bearing spline shaft 80 within the pivot bearing 82. With regard to the other reference numbers, see FIG. 1 and the detailed description thereof.

By a rocking movement of the substrates about their transverse axis at a low frequency between, say, 0.01 and 1 Hz, and a momentary pause of the substrates in their end positions, it can be brought about that the vapor particles will reach the substrate surface alternately at angles differing by 90°, for example. This leads to the information of short, spike-like crystals extending zig-zag through the coating from the substrate to the surface of the coating, so that the formation of interstices between the crystal spikes is largely suppressed.

What is claimed is:

1. Vacuum coating apparatus for coating all sides of substrates by rotation in a material stream comprising vacuum chamber means with an elongated material source having a longitudinal axis and a transverse axis, substrate rack means with a plurality of fastening points for the planar arrangement of a plurality of substrates above the material source in a substantially uniform distribution over its surface, drive means associated with the substrate rack means for rotating the substrates, the substrate rack means having two parallel substrate bearer means disposed fork-wise, whose longitudinal axes B—B and C—C are disposed in mirror-image symmetry with a plane of symmetry passing through the longitudinal axis A—A of the material source, coupling means for the substrates being disposed on the confronting inner sides of the substrate bearer means, the axes of rotation of the couplings being aligned perpendicular to the plane of symmetry, the substrate bearer means being connected by angle drive means to the coupling means and to a motor means via drive shaft means.

2. Coating apparatus of claim 1 wherein the coupling means of the one substrate bearer means are arranged offset from the coupling means of the other substrate bearer means longitudinally of the substrate bearer means by one-half the distance between two adjacent coupling means.

3. Coating apparatus of claim 1 wherein the substrate bearer means are constructed as hollow bodies which envelop the drive shaft means and the angle drive means.

4. Coating apparatus of claim 1 wherein the drive shaft means passes through all coupling means and the angle drive means comprise a pinion disposed on the drive shaft means and a crown gear disposed on the coupling shaft.

5. Coating apparatus of claim 1 wherein the substrate bearer means are disposed on two radial arms which are rockable about a common shaft lying in the plane of symmetry of the material source, the axis of the common shaft lying on the plane of symmetry of both rocking ranges.

6. Coating apparatus of claim 5 wherein the radial arms are disposed each on one of two hollow shafts which are coaxial with one another and are connected together by a reverse gearing whose idler gear is disposed in a stationary manner.

7. Coating apparatus of claim 6 wherein within the hollow shafts for the movement of the radial arms, an additional coaxial shaft system is disposed for the transfer of a rotatory movement to the substrates, a reverse gearing having a stationary idler gear being disposed between the shafts.

8. Coating apparatus of claim 6 wherein the hollow shafts for the movement of the radial arms have associated therewith a rocking drive including a motor and a crank drive having a rocking output wheel which is connected to one of the hollow shafts.

9. Coating apparatus of claim 8 wherein there is associated with the coaxial shaft system for the transfer of the rotatory movement to the substrates a motor which in turn is mounted in a pivot bearing for rotatory movement as a whole about the motor axis, and the motor is connected to the output gear of the crank drive for the rocking movement of the radial arms in a 1:1 ratio.

10. Coating apparatus of claim 9 wherein the output gear of the crank drive is connected to the hollow shafts of the radial arms and to the motor for the rotation of the substrates through a common, slip-free driving means.

11. Coating apparatus of claim 1 wherein the substrate bearer means are cantilevered on a carriage and can be introduced into the vacuum chambers means by means of the carriage.

12. Coating apparatus of claim 11 wherein the carriage has a housing in which the reverse gearing of the hollow shafts and of the coaxial shaft system, respectively, are disposed, and in which the hollow shafts are journaled, and ball bearing spline shafts are provided for the transfer of the driving torques from the stationary motors to the turning drives.

13. Coating apparatus of claim 9 wherein the ball bearing spline shafts of the motor for the rotatory movement of the substrates are connected with a position indicator for indicating the attitude of the substrates on their axis of rotation with respect to the material source.

14. Coating apparatus of claim 13 wherein the output gear of the crank drive for the rocking movement of the radial arms is likewise connected with a position indicator for indicating the angular attitude of the radial arms and the two position indicators are disposed concentrically to one another.

15. Coating apparatus of claim 6 wherein the coaxial hollow shafts are constructed at their ends facing the substrate bearer means as interfitting casings from which the radial arms extend radially outward to the substrate bearers, angle drives are disposed in the casings and shafts and in the arms for the transmission of the rotatory movement to the drive shafts in the carrier arms, and casings are likewise situated at the junctions between the arms and the substrate bearers, in which additional angle drives are disposed.

* * * * *